United States Patent
Okamoto et al.

(10) Patent No.: US 7,405,579 B2
(45) Date of Patent: Jul. 29, 2008

(54) VOLTAGE DETECTOR AND INSULATOR INTERFACE

(75) Inventors: Hajime Okamoto, Shizuoka (JP);
Satoshi Ishikawa, Shizuoka (JP);
Ryosuke Kawano, Oita (JP)

(73) Assignee: Yazaki Corporation, Tokyo (JP)

( * ) Notice: Subject to any disclaimer, the term of this patent is extended or adjusted under 35 U.S.C. 154(b) by 109 days.

(21) Appl. No.: 11/636,499

(22) Filed: Dec. 11, 2006

(65) Prior Publication Data
US 2007/0132457 A1 Jun. 14, 2007

(30) Foreign Application Priority Data
Dec. 12, 2005 (JP) ............ 2005-357307
Nov. 2, 2006 (JP) ............ 2006-299234

(51) Int. Cl.
*G01R 27/08* (2006.01)
(52) U.S. Cl. ............... 324/713; 320/116; 320/118; 324/429
(58) Field of Classification Search ........... 324/713, 324/427, 429, 436; 320/118, 119; 702/68, 702/FOR. 106, FOR. 111
See application file for complete search history.

(56) References Cited
U.S. PATENT DOCUMENTS

| | | | | |
|---|---|---|---|---|
| 6,020,717 A | * | 2/2000 | Kadouchi et al. | 320/116 |
| 6,094,031 A | * | 7/2000 | Shimane et al. | 320/118 |
| 6,133,707 A | * | 10/2000 | Kikuchi et al. | 320/104 |
| 6,198,252 B1 | * | 3/2001 | Mukainakano | 320/128 |
| 6,236,215 B1 | * | 5/2001 | Kanehira | 324/429 |
| 7,194,362 B2 | * | 3/2007 | Ishikawa et al. | 702/57 |
| 2006/0028179 A1 | * | 2/2006 | Yudahira et al. | 320/133 |
| 2006/0103350 A1 | * | 5/2006 | Lai | 320/118 |
| 2007/0013347 A1 | * | 1/2007 | Kamohara | 320/160 |
| 2007/0236173 A1 | * | 10/2007 | Kimura | 320/112 |

FOREIGN PATENT DOCUMENTS
JP 2000-88898 3/2000

* cited by examiner

*Primary Examiner*—Vincent Q. Nguyen
*Assistant Examiner*—Benjamin M Baldridge
(74) *Attorney, Agent, or Firm*—Kratz, Quintos & Hanson, LLP (57) ABSTRACT

The present invention is to provide a voltage detector having a common communication line for reducing a manufacturing cost. A low voltage line CPU transmits a detection instruction including an assignment of one address among a plurality of blocks. The detection instruction is branched by a transmitting bus line for concurrently transmitting to a plurality of voltage detector units. When one of the voltage detector units receives the detection instruction with the address being same as a self-address thereof, the voltage detector unit detects output voltages of unit cells and transmits the detected result to the low voltage line CPU. When the received address is not the self-address, the voltage detector unit does not transmit the detected result.

11 Claims, 11 Drawing Sheets

VOLTAGE DETECTOR AND INSULATOR INTERFACE

BACKGROUND OF THE INVENTION

1. Field of the Invention

The present invention relates to a voltage detector for detecting each output voltage of a plurality of unit cells connected in series of an in-vehicle high voltage battery.

2. Description of the Related Art

A Hybrid Electric Vehicle (HEV) utilizing an engine and an electric motor becomes widely used. The HEV has a low voltage battery of 12 volts for starting the engine and a high voltage battery for driving the electric motor. The high voltage battery is formed with a plurality of unit cells, connected in series, such as a nickel-metal hydride secondary battery or a lithium secondary battery.

When the high voltage battery is repeatedly charged and discharged, the unit cells each have a different output voltage or a state of charge (SOC). As for the charge and discharge of the high voltage battery, the charge is terminated when the unit cell having the highest SOC (or output voltage) reaches to a predetermined upper limit of SOC, and the discharge is terminated when the unit cell having the lowest SOC (output voltage) reaches to a predetermined lower limit of SOC, for endurance and safety of the high voltage battery. The uneven SOCs of the unit cells thus actually reduce available capacity of the high voltage battery. In other words, an assistance (to assist the engine with the battery when running up-hill) and a regeneration (to regenerate the battery when running down-hill) become not enough so that a dynamic performance or fuel consumption of the HEV is reduced. It is therefore necessary to detect each output voltage of the unit cells to uniform the SOC of each unit cell.

Figure 11:
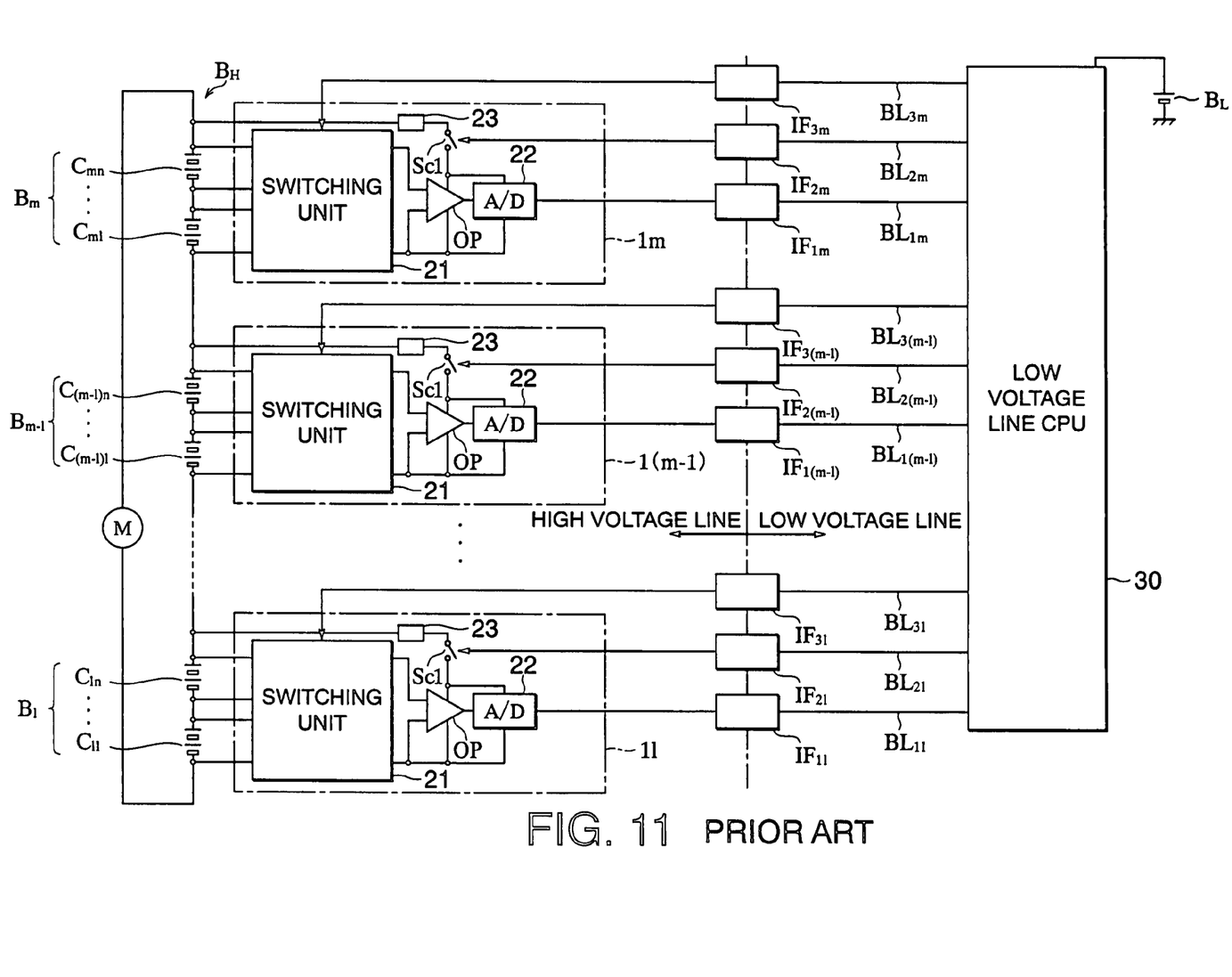
FIG. 11 is a circuitry of a conventional voltage detector.

FIG. 11 shows a conventional voltage detector to detect an output voltage of each unit cell of a high voltage battery (refer to JP,2000-88898, A). BL denotes a low voltage battery, for example, one secondary battery.

BH denotes the high voltage battery to drive an electric motor M and is connected to an alternator (not shown) for charge.

The high voltage battery BH is divided into m blocks B1-Bm and each block has n (arbitrary number) unit cells and each unit cell has x (arbitrary number) secondary batteries.

The voltage detector has voltage detector units 11-1m in a high voltage line and a voltage detector control device 30 (low voltage line CPU 30) in a low voltage line. The low voltage line CPU 30 is powered by the low voltage battery BL and controls the voltage detector units 11-1m corresponding to the blocks B1-Bm, respectively. Each voltage detector unit 11-1m is powered only by the respective blocks B1-Bm. The voltage detector units 11-1m have the respective ground levels for the blocks B1-Bm at negative terminals so that withstand voltages of the voltage detector units 11-1m are reduced.

Each voltage detector unit 11-1m includes a switching unit 21 connected with a positive and negative terminals of each unit cell of the corresponding block B1-Bm. Each switching unit 21 is connected to an associated differential amplifier OP. The output voltages detected by the differential amplifiers OP are converted to digital values with analogue-digital converters (A/D). The converted values are inputted to the low voltage line CPU 30 through insulator interfaces IF11-IF1m, such as photo-couplers, and bus lines BL11-BL1m.

The low voltage line CPU 30 supplies switching control signals as detection instructions to the switching units 21 via the insulator interfaces IF31-IF3m and bus lines BL31-BL3m to connect the positive and negative terminals of the unit cells C11-Cmn with the differential amplifiers OP in order.

The voltage detector units 11-1m each have a power supply circuit 23, which supplies a constant voltage to operate the associated differential amplifier OP and A/D converter 22 with the associated output voltage of the block B1-Bm, and a cutoff switch Sc1 interconnected between a junction of the differential amplifier OP and A/D converter 22, and the power supply circuit 23.

The low voltage line CPU 30 outputs OFF signals to the cutoff switches Sc1 when the voltages are not detected via the bus lines BL21-BL2m and the insulator interfaces IF21-IF2m. When the cutoff switches Sc1 are turned off, the differential amplifiers OP and the A/D converters 22 are powered off from the blocks B1-Bm to save the power.

The conventional voltage detector inputs the output voltage of each unit cell C11-Cmn detected by the associated differential amplifier OP to the low voltage line CPU 30 in order so that the low voltage line CPU 30 requires output terminals of the same number as the number of the blocks B1-Bm for outputting the switching control signals to the respective voltage detector units 11-1m. The conventional voltage detector also requires the bus lines BL11-BL1m to transmit the switching control signals same as the number of the blocks B1-Bm, resulting to an increase of a number of parts and a large size of the low voltage line CPU 30 and causing an increasing manufacturing cost.

The conventional voltage detector directly outputs the OFF signals to the cutoff switches Sc1 of the blocks B1-Bm from the output terminals through the bus lines BL21-BL2m. The low voltage line CPU 30 requires the m output terminals to output the OFF signals to the blocks B1-Bm and the m bus lines BL21-BL2m to transmit the OFF signals.

The conventional voltage detector requires the bus lines BL11-BL1m and BL21-BL2m to send the switching control signals and the OFF signals of the cutoff switches Sc1 and also requires the insulator interfaces IF11-IF1m and IF21-IF2m so that the low voltage line CPU 30 becomes large and increases the cost.

SUMMARY OF THE INVENTION

An object of the present invention is to provide a voltage detector having a common communication line, a simple configuration, and a low manufacturing cost.

According to a first aspect of the present invention, a voltage detector includes: a plurality of voltage detector units for detecting output voltages of cells and transmitting the detected results, the voltage detector units each being powered by an associated block of a plurality of blocks divided from a high voltage battery having a plurality of secondary unit cells connected in series each other; a voltage detector control device powered by a low voltage battery with a voltage lower than the high voltage battery for transmitting a detection instruction to the plurality of the voltage detector units; a communication line interconnected between the plurality of the voltage detector units and the voltage detector control device; an insulator interface arranged on the communication line for communicating between the plurality of the voltage detector units and the voltage detector control device in an electrically insulated manner; wherein the communication line has a first communication line for transmitting the detection instruction, the first communication line having a first main line and a plurality of first branch lines, one end of the first main line being connected to the voltage detector control device, the plurality of the first branch lines being branched from the first main line and connected to the respective voltage detector units; the voltage detector control device transmits the detection instruction including an assignment of an address of the blocks to the plurality of the voltage detector units through the first communication line; and the plurality of the voltage detector units each detect the output voltages of the associated block when the address of the detection instruction transmitted from the voltage detector control device through the first communication line is a self-address of the voltage detector unit.

Preferably, the communication line has a second communication line for transmitting the detected results, the second communication line having a second main line and a plurality of second branch lines, one end of the second main line being connected to the voltage detector control device, the plurality of the second branch lines being branched from the second main line and connected to the respective voltage detector units.

Preferably, the insulator interface has a first transmitting element connected to one end of the first main line for transmitting an optical or magnetic signal, and a plurality of first receiving elements connected to ends of the first branch lines for receiving the optical and magnetic signal, and the first transmitting element and the plurality of the first receiving elements are arranged so as that all of the first receiving elements can receive the optical or magnetic signal from the first transmitting element.

Preferably, the insulator interface includes the first transmitting element connected to the one end of the first main line for transmitting the optical or magnetic signal, the plurality of the first receiving elements connected to the ends of the first branch lines for receiving the optical or magnetic signal, a second receiving element connected to one end of the second main line for receiving the optical or magnetic signal, and a plurality of second transmitting elements connected ends of the second branch lines for transmitting the optical or magnetic signals, and the first transmitting element, the first receiving elements, the second transmitting elements, and the second receiving element are arranged so as that all of the first and second receiving elements can receive the optical or magnetic signals from all of the first and second transmitting elements.

Preferably, a branch point of the main line and each branch line is placed between the voltage detector control device and the insulator interface.

Preferably, the plurality of the voltage detector units have external resistors having different values of resistances to be recognized as self-addresses.

Preferably, the plurality of the voltage detector units each have a sensor device for detecting the output voltages of the unit cells of the respective blocks and outputting the detected results, and a control device for transmitting the detected results to the voltage detector control device from the sensor device responsive to the detection instruction, the voltage detector control device transmits a cutoff instruction through the first communication line, and the control device cutoffs the electrical power to the sensor device when received the cutoff instruction.

According to a second aspect of the present invention, a voltage detector includes: a plurality of voltage detector units for detecting output voltages of cells and transmitting the detected results, the voltage detector units each being powered by an associated block of a plurality of blocks divided from a high voltage battery having a plurality of secondary unit cells connected in series each other; a voltage detector control device powered by a low voltage battery with a voltage lower than the high voltage battery for transmitting a detection instruction to the plurality of the voltage detector units; a communication line interconnected between the plurality of the voltage detector units and the voltage detector control device; an insulator interface arranged on the communication line for communicating between the plurality of the voltage detector units and the voltage detector control device in an electrically insulated manner; wherein the insulator interface has a plurality of insulator devices formed with a pair of light emitting elements and light detecting elements operated with a same voltage supply and connected to the voltage detector control device and the respective voltage detector units, the light emitting and detecting elements are electrically insulated and arranged so as that all of the light detecting elements can receive lights from at least the light emitting element of the insulator devices connected to the voltage detector control device, the voltage detector control device transmits the detection instruction including an assignment of an address of one of the blocks through the light emitting element to the plurality of the voltage detector units; and the plurality of the voltage detector units detect the output voltages of the blocks when the address of the detection instruction transmitted from the voltage detector control device through the light emitting element of the insulator device are self-addresses.

Preferably, the insulator interface utilized in the voltage detector has a plurality of the insulator devices as one package.

Preferably, the insulator devices have a plurality of common terminals connected to the respective junctions of the light emitting and detecting elements, and a plurality of terminals connected to each end of the light emitting and light detecting elements.

Preferably, the insulator devices are formed in one optical device as one package.

DETAILED DESCRIPTION OF THE PREFERRED EMBODIMENTS

First Embodiment

Figure 1:
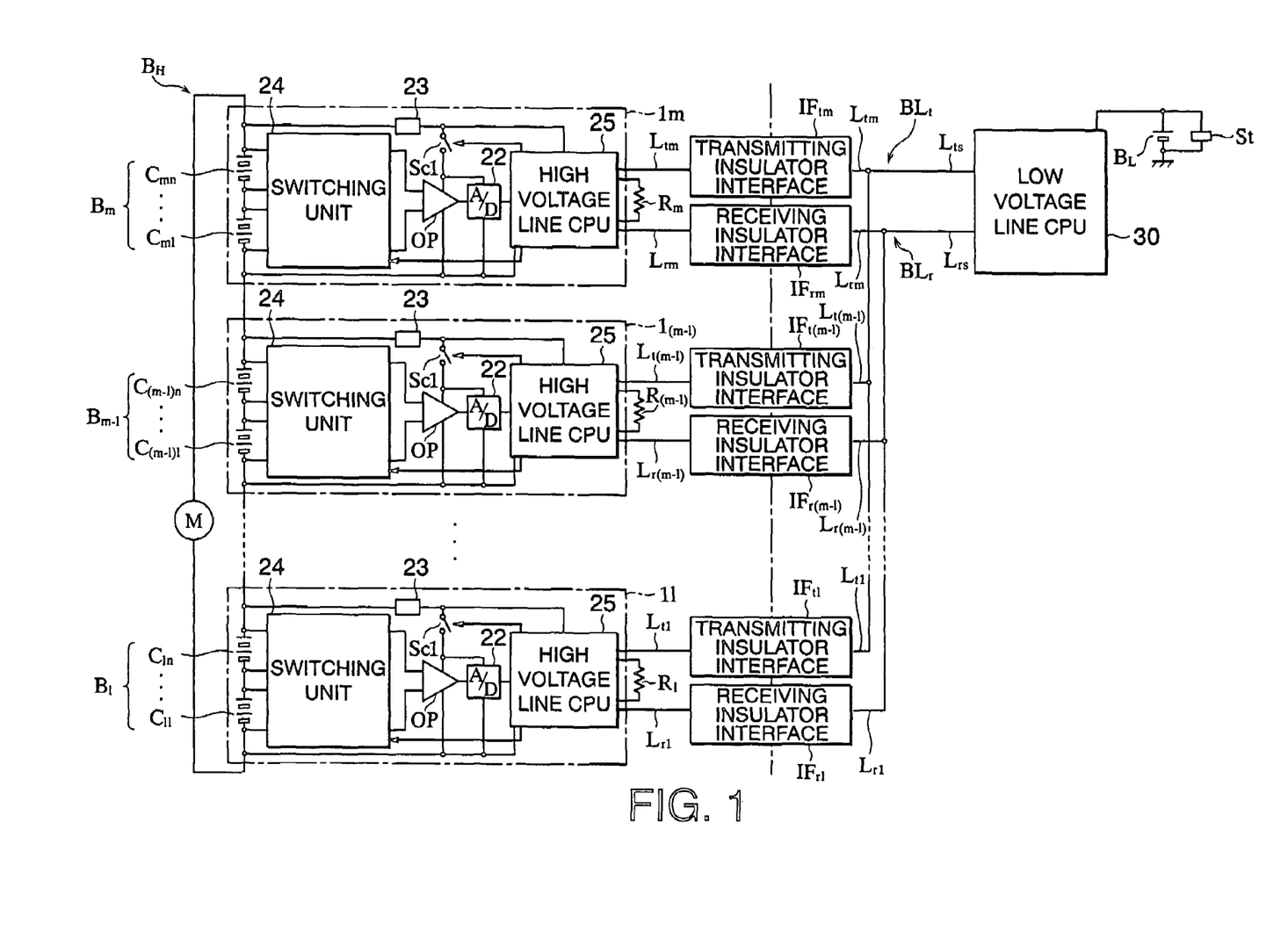
FIG. 1 is a circuitry of a first embodiment of a voltage detector of the present invention.

FIG. 1 shows a circuitry of a first embodiment of a voltage detector of the present invention. The voltage detector includes a low voltage battery BL (in-vehicle low voltage battery) of a secondary battery. The low voltage battery BL powers a starter St to start an engine and is connected with an alternator as a battery charger.

The voltage detector has a high voltage battery BH. The high voltage battery BH powers an electric motor M of a Hybrid Electric Vehicle (HEV) and is as appropriate connected with the alternator (not shown) as the battery charger.

The high voltage battery BH is divided into m blocks B1-Bm (m: an arbitrary integral number) and each block B1-Bm has n unit cells of C11-C1n, C(m−1)-C(m−1)n, Cm1-Cmn (n: an arbitrary integral number). Each unit cell C11-Cmn has x secondary batteries (x: an arbitrary integral number).

The voltage detector has voltage detector units 11-1m in a high voltage line and a voltage detector control device 30 (low voltage line CPU 30) in a low voltage line. The low voltage line CPU 30 is powered by the low voltage battery BL and controls the voltage detector units 11-1m corresponding to the blocks B1-Bm, respectively. Each voltage detector unit 11-1m is powered only by the associated block B1-Bm. The voltage detector units 11-1m have the respective ground levels for the blocks B1-Bm at negative terminals so that withstand voltages of the voltage detector units 11-1m are reduced.

Each voltage detector unit 11-1m includes a differential amplifier OP to detect an output voltage of each unit cell of the associated block B1-Bm, a switching unit 24 to connect the terminals of the unit cell to the differential amplifier OP, an A/D converter 22 to convert the detected output voltage to a digital value, and a control device (high voltage line CPU 25) to control the switching unit 24. Each switching unit 24 has a plurality of switches, each of the switches is connected to one unit cell of the respective block B1-Bm and is normally closed. Each differential amplifier OP and A/D converter 22 forms a sensor device.

Each voltage detector unit 11-1m has a power supply circuit 23, which supplies a constant voltage to operate the differential amplifier OP, the A/D converter 22, and the high voltage line CPU 25 with the associated block B1-Bm, and a cutoff switch Sc1 interconnected between a junction of the differential amplifier OP and the A/D converter 22, and the power supply circuit 23. Each cutoff switch Sc1 is turned on and off with the corresponding high voltage line CPU 25.

Each voltage detector unit 11-1m is formed in one chip and has an external resistor R1-Rm mounted outside the chip. The external resistors R1-Rm correspond to addresses of the blocks B1-Bm and have their respective different values.

The voltage detector has a transmitting bus line BLt (a first communication line) and a receiving bus line BLr (a second communication line) between the voltage detector units 11-1m and the low voltage line CPU 30. The transmitting bus line BLt has a first main line Lts and a plurality of first branch lines Lt1-Ltm. One end of the first main line Lts is connected to the low voltage line CPU 30. The other end of the first main line Lts is connected with the first branch lines Lt1-Ltm. The first branch lines Lt1-Ltm are connected to the respective voltage detector units 11-1m. The receiving bus line BLr has a second main line Lrs and a plurality of second branch lines Lr1-Lrm. One end of the second main line Lrs is connected to the low voltage line CPU 30. The other end of the second main line Lrs is connected with the second branch lines Lr1-Lrm. The second branch lines Lr1-Lrm are connected to the respective voltage detector units 11-1m. Transmitting insulator interfaces IFt1-IFtm are disposed between the first main line Lts and the first branch lines Lt1-Ltm and receiving insulator interfaces IFr1-IFrm are disposed between the second main line Lrs and the second branch lines Lr1-Lrm. The branch points of the transmitting and receiving bus lines BLt and BLr are arranged in the low voltage line with respect to the transmitting and receiving insulator interfaces IFt1-IFtm and IFr1-IFrm.

The insulator interfaces IFt1-IFtm and IFr1-IFrm connect the voltage detector units 11-1m with the low voltage line CPU 30 in an electrically insulated manner. The voltage detector units 11-1m and the low voltage line CPU 30 are capable of transmitting and receiving information at the insulated state via the insulator interfaces IFt1-IFtm and IFr1-IFrm. The high voltage battery BH and low voltage battery BL thereby are insulated each other. The insulator interfaces IFt1-IFtm and IFr1-IFrm are optical devices such as photo-couplers of a light emitting element and a light detecting element, or magnetic devices such as magnetic-couplers.

Figure 2:
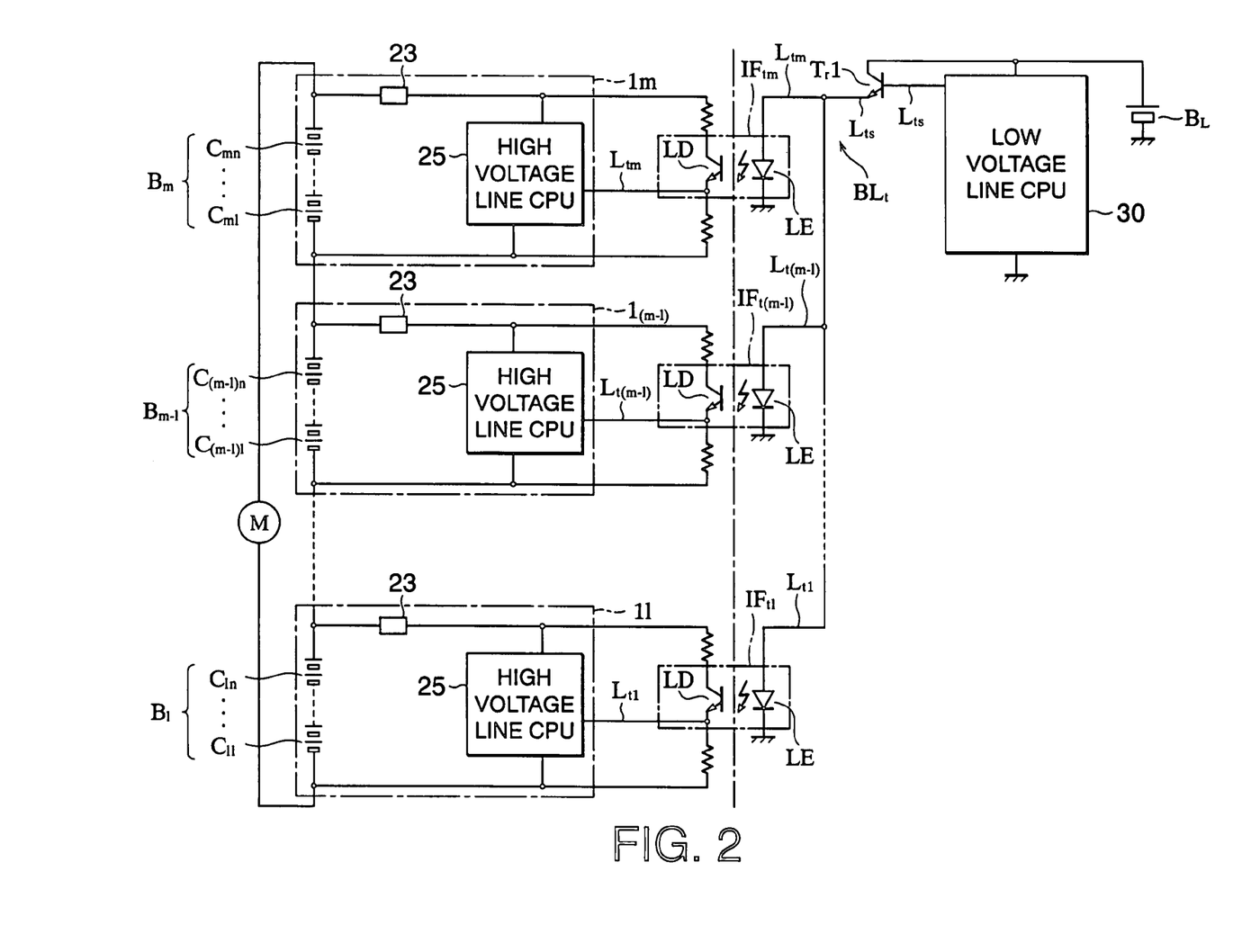
FIG. 2 is a detailed electrical connection of the voltage detector of FIG. 1 when photo-couplers are utilized for transmitting insulator interfaces.

FIG. 2 shows an electrical connection of the transmitting insulator interfaces (photo-couplers) IFt1-Iftm of the voltage detector of FIG. 1. The detail of the voltage detector units 1'-1m, the receiving insulator interfaces IFr1-IFrm, and the receiving bus line BLr are omitted. As shown in FIG. 2, the transmitting insulator interfaces IFt1-IFtm have light emitting elements LE, which are arranged in the low voltage line operated with the low voltage battery BL, and light detecting elements LD, which are arranged in the high voltage line operated with the high voltage battery BH. The light emitting elements LE are powered by the low voltage battery BL via an emitter-collector of a transistor Tr1 and connected in parallel each other. A base of the transistor Tr1 is connected to the low voltage line CPU 30, which turns on the transistor Tr1 to light the light emitting elements LE.

The light detecting elements LD are connected to the respective blocks B1-Bm. The light detecting elements LD are turned on when received lights from the light emitting elements LE and supply electrical signals to the high voltage line CPUs 25. The electrical signals are thereby transmitted from the low voltage line CPU 30 to the high voltage line CPUs 25 at the electrically insulated state. The transmitting bus line BLt is apparently formed with connection lines between the low voltage CPU 30 and the transistor Tr1, between the emitter of the transistor Tr1 and the light emitting elements LE, and between the light detecting elements LD and the high voltage line CPUs 25.

Figure 3:
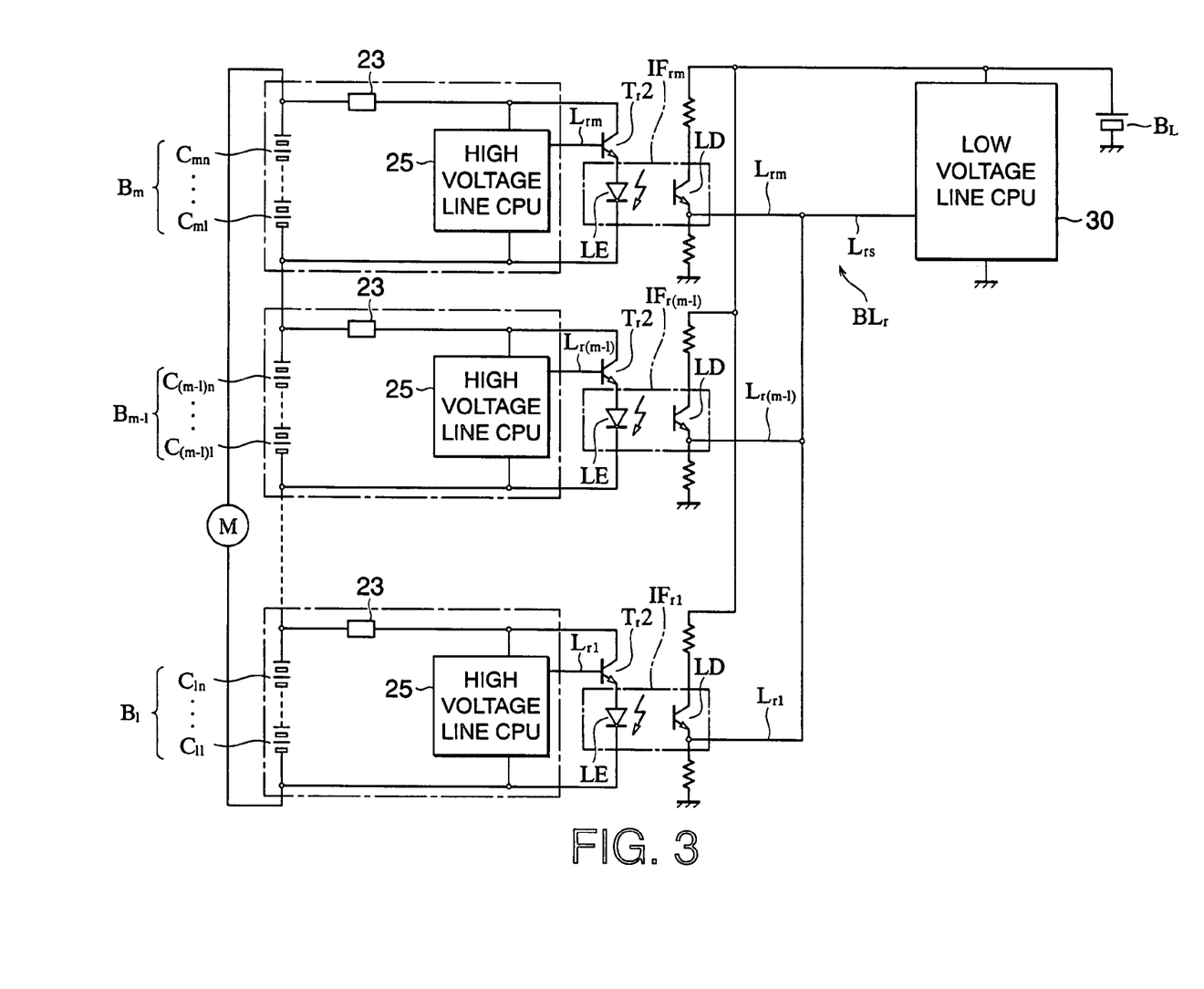
FIG. 3 is a detailed electrical connection of the voltage detector of FIG. 1 when photo-couplers are utilized for receiving insulator interfaces.

FIG. 3 shows that the receiving insulator interfaces IFr1-IFrm of FIG. 1 utilize the photo-couplers. The detail of the voltage detector units 11-1m, the transmitting insulator interfaces IFt1-IFtm, and the transmitting bus line BLt are omitted. As shown in FIG. 3, the receiving insulator interfaces IFr1-IFrm have the light detecting elements LD at the low voltage line and the light emitting elements LE at the high voltage line. The light emitting elements LE are powered by the unit cells of the respective blocks B1-Bm via the respective emitters and collectors of transistors Tr2. A base of each transistor Tr2 is connected to the corresponding high voltage CPU 25, which turns on and off the transistor Tr2. The high voltage lines CPUs 25 turn on the transistors Tr2 to light the light emitting elements LE powered by the unit cells of the blocks B1-Bm.

The light detecting elements LD are connected in parallel each other and interconnected with the low voltage battery BL and the grounds. The receiving bus line BLr of the low voltage line CPU 30 is branched into a plurality of lines to be connected to the grounds of the respective light detecting elements LD. The light detecting elements LD are turned on when receiving the lights from the light emitting elements LE and supply the electrical signals to the low voltage line CPU 30 via the receiving bus line BLr. The electrical signals are thereby transmitted from the high voltage line CPUs 25 to the low voltage line CPU 30 in the electrically insulated state. The receiving bus line BLr is apparently formed with connection lines between the high voltage line CPUs 25 and the bases of the transistors Tr2, between the emitters of the transistors Tr2 and the light emitting elements LE, and between the low voltage line CPU 30 and the ground levels of the light detecting elements LD.

Figure 4:
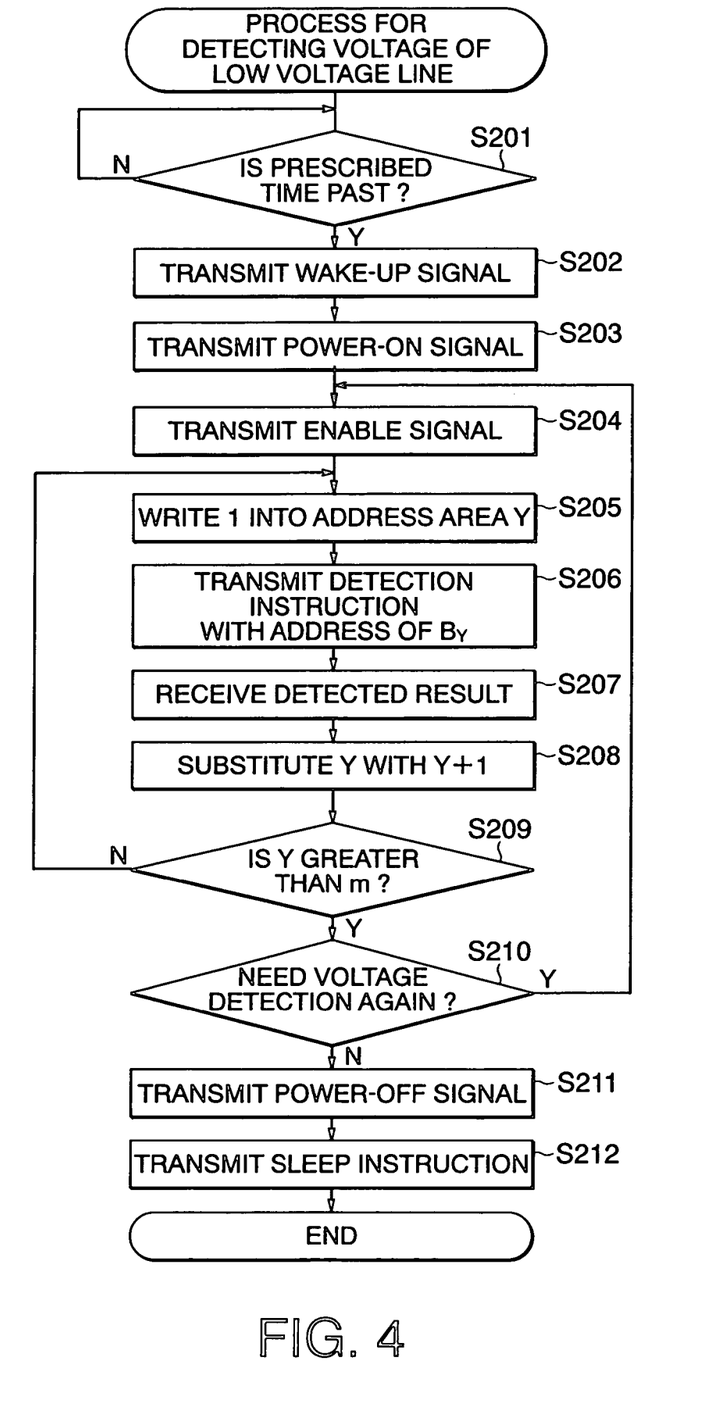
FIG. 4 is a flowchart showing a process of detecting a voltage of a low voltage line CPU of the voltage detector of FIG. 1.
Figure 5:
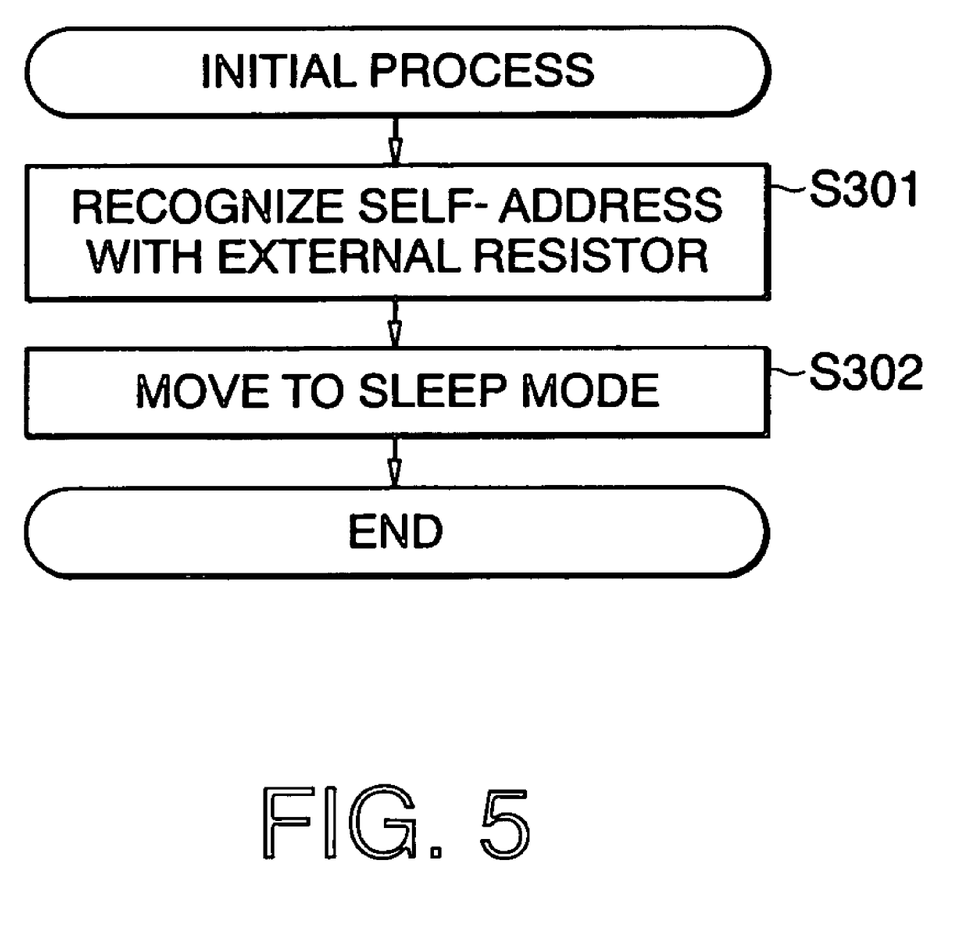
FIG. 5 is a flowchart showing an initial process of a high voltage line CPU of the voltage detector of FIG. 1.
Figure 6:
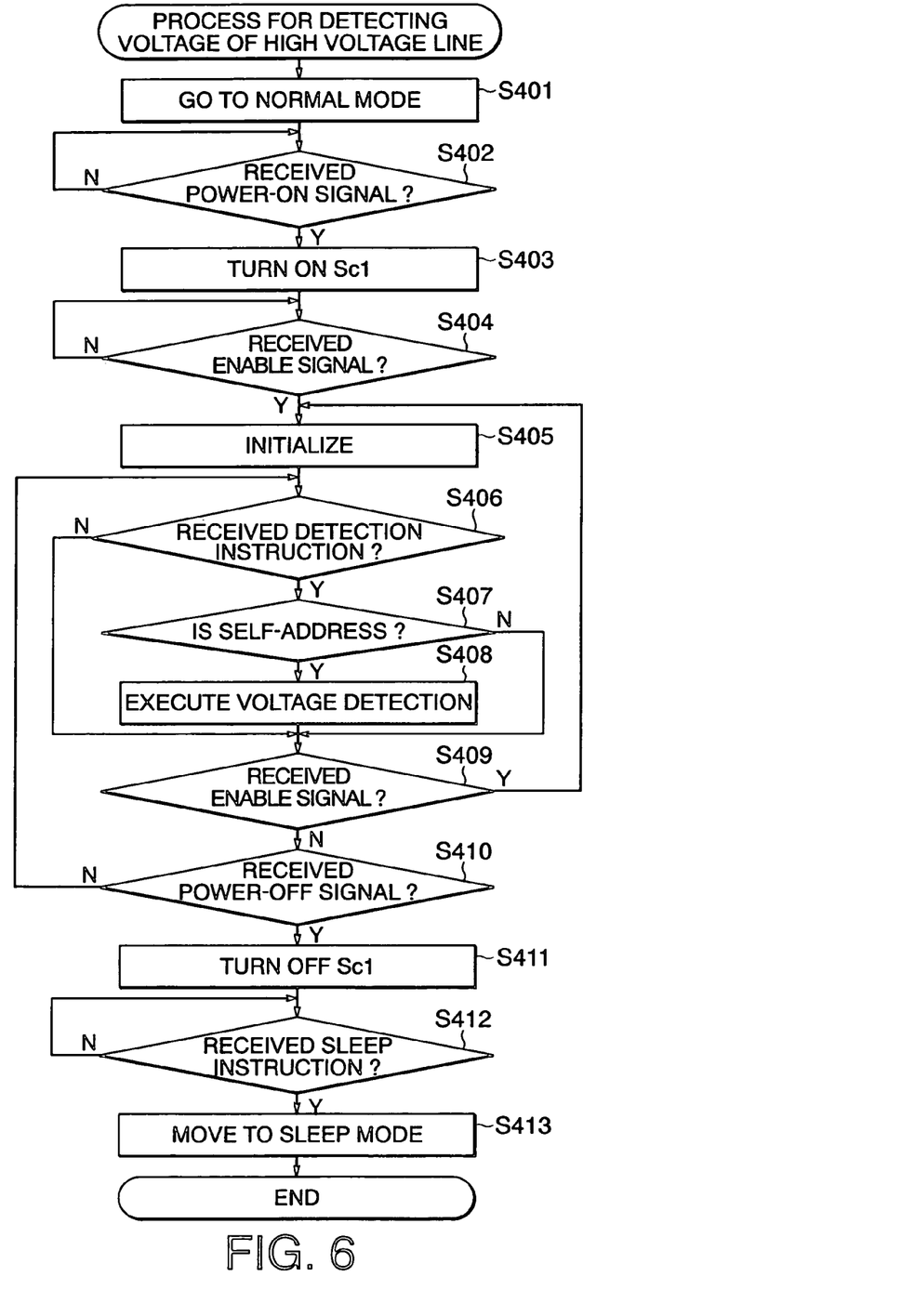
FIG. 6 is a flowchart showing a process of detecting a voltage of the high voltage line CPU of the voltage detector of FIG. 1.

FIG. 4 shows a flowchart of process for detecting the output voltage with the low voltage line CPU 30, FIG. 5 shows a flowchart of initial process of the high voltage line CPUs 25, and FIG. 6 shows a flowchart of process for detecting the output voltage with the high voltage line CPUs 25. At the initial process, each high voltage line CPU 25 is powered with the associated power supply circuit 23 and reads a resistance value of the external resistor R1-Rm. At step S301, the resistance value is stored in a memory device (not shown) and the high voltage line CPU 25 moves to a sleep mode (step S302) and the process ends. At the sleep mode, operating clocks of the low voltage line CPU 30 and high voltage line CPUs 25 are switched from high frequencies to low frequencies.

As shown in FIG. 4, the low voltage line CPU 30 starts a process for detecting a voltage of the low voltage line after an ignition switch is turned off. At step S201, the low voltage line CPU 30 waits a prescribed time until the voltage of the high voltage battery BH becomes steady. The low voltage line CPU 30 outputs a wake-up signal at step S202, a power-on signal at step S203, and an enable signal at step S204, to the transmitting bus line BLt. The wake-up signal, power-on signal, and enable signal are branched into the transmitting insulator interfaces IFt1-IFtm and transmitted to the respective high voltage line CPUs 25 in order.

When the wake-up signals are transmitted to the high voltage line CPUs 25, as shown in FIG. 6, each high voltage line CPU 25 starts a process for detecting the voltage of the high voltage line and changes the operation clock from the low frequency clock to the high frequency clock and goes to the normal mode from the sleep mode at step S401. When the high voltage line CPUs 25 receive the power-on signals from the low voltage line CPU 30 (Y at step S402), the high voltage line CPUs 25 turn on the cutoff switches Sc1 at step S403. Each differential amplifier OP and A/D converter of the voltage detector units 11-1m is powered with the associated block B1-Bm. When the high voltage line CPUs 25 receive the enable signals from the low voltage line CPU 30 (Y at step S404), the high voltage line CPUs 25 reset the operation clock to initialize (step S405).

Meanwhile, the low voltage line CPU 30 writes 1 into an address area Y of a memory device (not shown) at step S205 as shown in FIG. 4 and outputs a detection instruction to the transmitting bus line BLt to assign an address of a block BY (step S206). The detection instruction is branched at the transmitting bus line BLt to supply all of the high voltage line CPUs 25 through the transmitting insulator interfaces IFt1-IFtm.

When the high voltage line CPUs 25 receive the detection instructions from the low voltage line CPU 30 (Y at step S406), each high voltage line CPU 25 judges at step S407 whether the address assigned by the detection instruction is a self-address or not. If the address is not the self-address (N at step S407), the process goes to step S409. If the address is the self-address (Y at step S407), the process executes the voltage detection at step S408 and goes to step S409.

For detecting the output voltage, the high voltage line CPU 25 of the block BY controls the switching unit 24 to connect the positive and negative terminals of each unit cell CY1-CYn of the block BY to the differential amplifier OP in order. Each output voltage of the unit cells CY1-CYn is inputted in order with a digital value to the high voltage line CPU 25 through the A/D converter. The high voltage line CPU 25 of the block BY transmits the digital values of the output voltages of the unit cells CY1-CYn of the assigned self-address to the receiving insulator interfaces IFrY. The low voltage line CPU 30 then receives the digital output voltages of the unit cells CY1-CYn via the receiving bus line BLr.

The low voltage line CPU 30 stores the received digital output voltage values into the memory device (not shown), step S207 in FIG. 4, and substitutes Y with Y+1 at step S208. If Y is not greater than m (N at step S209), the low voltage CPU 30 returns to step S205. If Y is greater than m (Y at step S209), the low voltage line CPU 30 judges a termination of the voltage detection of the whole unit cells C11-Cmn and moves to step S210.

When the output voltages of the unit cells C11-Cmn do not have a variation, the low voltage line CPU 30 stops the voltage detection (N at step S210) and moves steps S211 and S212. If the output voltages of the unit cells C11-Cmn have variations, the low voltage line CPU 30 instructs an equalizing apparatus (not shown) to equalize the unit cells. When the low voltage line CPU 30 receives a signal of termination of equalization from the equalizing apparatus, the voltage detection is again executed (Y at step S210) by returning to step S204 to transmit the enable signal.

At steps S211 and S212, the low voltage line CPU 30 outputs a power-off signal (cutoff instruction) and sleep instruction to the transmitting bus line BLt in order and ends the process. The power-off signal and sleep instruction are branched into the transmitting insulator interfaces IFt1-IFtm with the transmitting bus line BLt and supplied to all of the high voltage line CPUs 25.

When the high voltage line CPUs 25 receive the enable signals (Y at step S409 of FIG. 6), they move to step S405. When the power-off signals are received (Y at step S410), all of the high voltage line CPUs 25 turn off the cutoff switches Sc1 (step S411). The differential amplifier OP and A/D converter of each voltage detector unit 11-1m is powered off from the corresponding block B1-Bm. When the sleep instructions (Y at step S412) are received, the high voltage line CPUs 25 move from the normal mode to the sleep mode (step S413) and end the process.

According to the above voltage detector, the low voltage line CPU 30 assigns one of the addresses of the plurality of the blocks B1-Bm and transmits the detection instruction to the assigned block. The detection instruction is concurrently transmitted through the first main line Lts and the first branch lines Lt1-Ltm to the high voltage line CPUs 25 of the voltage detector units 11-1m. When one of the high voltage line CPUs 25 receives the detection instruction with the address, which is the same as the self-address, from the low voltage line CPU 30, the associated high voltage line CPU 25 detects the output voltage of the associated block and transmits the detected result to the low voltage line CPU 30. If the received address is not same as the self-address of the block, the high voltage line CPU 25 does not transmit the detected result to the low voltage line CPU 30. Each detection instruction includes the associated address to instruct the voltage detection of the respective voltage detector units 11-1m without the plurality of the transmitting bus lines BLt responsive to the voltage detector units 11-1m. The detection instruction transmitted through the first main line Lts and the first branched lines Lt1-Ltm thereby assigns the respective voltage detector units 11-1m so that the configuration of the voltage detector becomes simple and reduces a manufacturing cost.

The high voltage line CPUs 25 of the voltage detector units 11-1m transmit the detected results through the receiving bus line BLr to the low voltage line CPU 30. The receiving bus line BLr has a second main line Lrs and second branch lines Lr1-Lrm. It is not necessary to arrange the receiving bus lines BLr for the respective voltage detector units 11-1m so that the configuration of the voltage detector becomes simple and reduces the manufacturing cost.

The branch point of the first main line Lts and the first branch lines Lt1-Ltm is arranged in the low voltage line with respect to the transmitting insulator interfaces IFt1-IFtm. The branch point of the second main line Lrs and the second branch lines Lr1-Lrm is arranged in the low voltage line with respect to the receiving insulator interfaces IFr1-IFrm. The high voltage line CPUs 25 are thus powered only the unit cells of the respective blocks B1-Bm. The low voltage line CPU 30 can communicate with the voltage detector units 11-1m having the respective ground levels through the transmitting and receiving bus lines BLt and BLr. The transmitting and receiving bus lines BLt and BLr having the first and second main lines Lts and Lrs, and the first and second branch lines Lt1-Ltm and Lr1-Lrm lower the withstand voltage of the voltage detector units 11-1m.

The voltage detector units 11-1m recognize the resistance values of the external resistors R1-Rm as the self-addresses. The voltage detector units 11-1m need not memory devices to memory the addresses or built-in resistors and can have a common configuration to reduce the manufacturing cost.

The low voltage line CPU 30 transmits the cutoff instruction via the transmitting bus line BLt. The high voltage line CPUs 25 receive the cutoff instructions and cut off the power supplies to the differential amplifiers OP and A/D converters 22. The low voltage line CPU 30 thus does not directly cut off the power supply to the differential amplifiers OP and A/D converters 22. The transmitting bus line BLt is utilized for transmitting the cutoff instruction to reduce the manufacturing cost.

The differential amplifiers are utilized for the sensor devices but not limited thereto. The sensor device can be any device such as a voltage-divider resistor, which is capable of outputting the current signal responsive to the output voltage of the unit cell C11-C1m.

The receiving bus line BLr has the second main line Lrs and second branch lines Lr1-Lrm but not limited thereto. The transmitting bus line BLt to transmit the detection instruction needs the first main line Lts and the first branch lines Lt1-Ltm. The receiving bus line BLr to transmit the detected results can be connected between the respective voltage detector units 11-m and the low voltage line CPU 30.

The cutoff instruction is transmitted through the transmitting bus line BLt but not limited thereto and transmitted via another line.

The high voltage line CPUs 25 recognize the resistance values of the external resistors R1-Rm as the self-addresses. The addresses can be assigned in other devices. Each voltage detector unit 11-1m may have the memory device to memory a table showing a relation between the resistance value of the associated resistor R1-Rm and a coded address. The associated high voltage line CPU 25 reads the coded address in the memory device and recognizes the self-address. The voltage detector units 11-1m have the same table with the same configurations.

The resistance values of the external resistors R1-Rm are adapted to the self-addresses but not limited thereto. The voltage detector units 11-1m may have the memory devices to memory the self-addresses or the built-in resistors corresponding to the resistance values.

Second Embodiment

In the first embodiment, the transmitting and receiving bus lines BLt and BLr are branched to the first and second branch lines Lt1-Ltm and Lr1-Lrm. The transmitting and receiving insulator interfaces IFt1-IFtm and IFr1-IFrm are connected with the respective branch lines but not limited thereto in the present invention.

Figure 7:
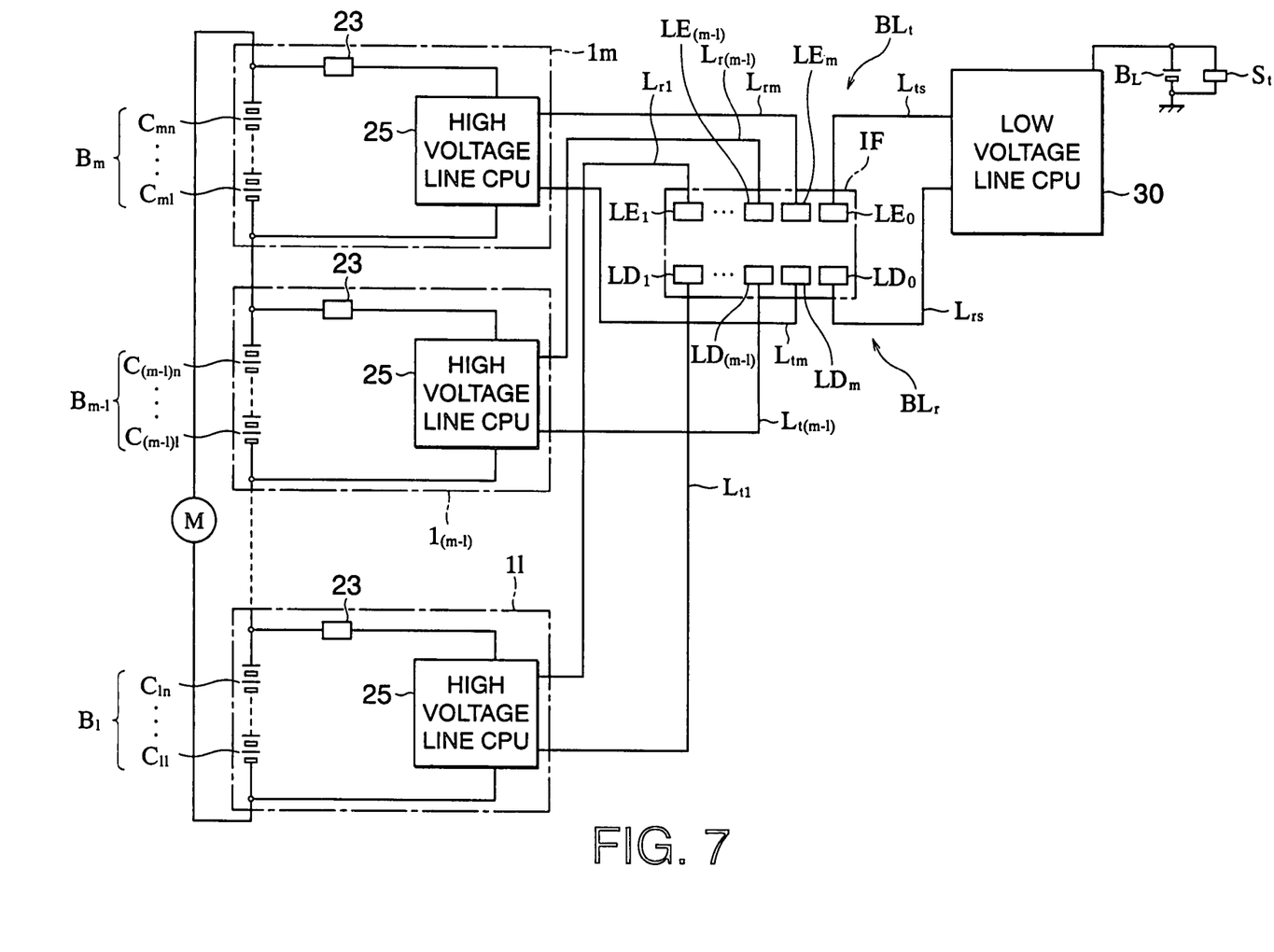
FIG. 7 is a circuitry of a second embodiment of a voltage detector of the present invention.

FIG. 7 designates the same reference signs for the same parts as those of FIG. 1. The detail of voltage detector units 11-1m is omitted. A transmitting bus line BLt has a first main line Lts, one end of which is connected to a low voltage line CPU 30, and a plurality of first branch lines Lt1-Ltm branched from the first main line Lts. Each first branch line Lt1-Ltm is connected to an associated high voltage line CPU 25 of the voltage detector units 11-1m.

A receiving bus line BLr has a second main line Lrs, one end of which is connected to the low voltage line CPU 30, and a plurality of second branch lines Lr1-Lrm branched from the second main line Lrs. Each second branch line Lr1-Lrm is connected to an associated high voltage line CPU 25 of the voltage detector units 11-1m.

An insulator interface IF has a light emitting element LE0 (first transmitting element) connected to the other end of the first main line Lts for transmitting a light signal, a plurality of light detecting elements LD1-LDm (first receiving elements) connected to the respective branch lines Lt1-Ltm for receiving the light signals, a second light detecting element LD0 (second receiving element) connected to other end of the second main line Lrs for receiving the light signals, and a plurality of second light emitting elements LE1-LEm (second transmitting elements) for transmitting the light signals.

All of the first and second light detecting elements LD1-LDm and LD0 are arranged to receive all of the light signals from the first and second light emitting elements LE0 and LE1-LEm.

Figure 8:
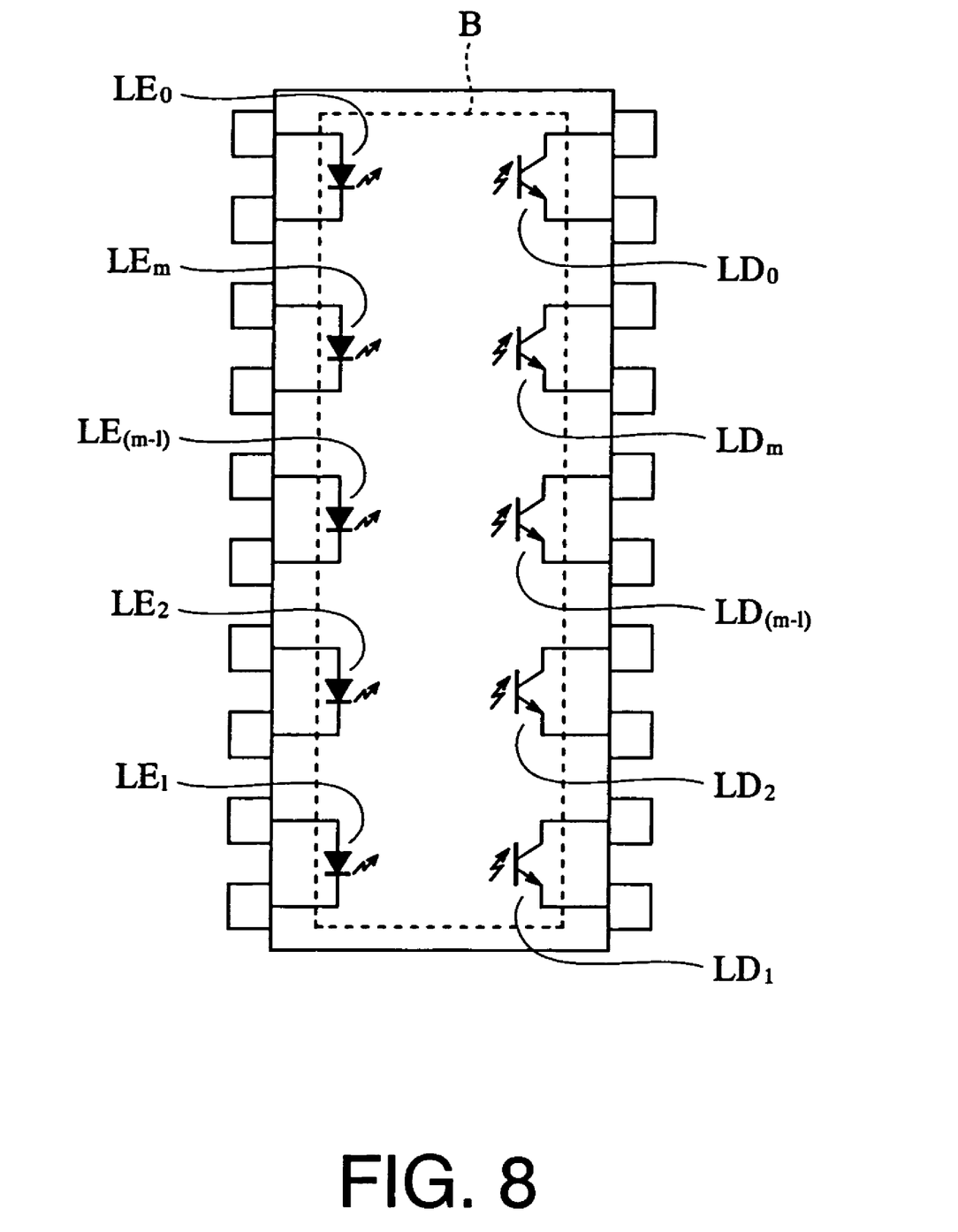
FIG. 8 shows a detailed arrangement of light emitting elements and light detecting elements of an insulator interface of FIG. 7.

As shown in FIG. 8, the insulator interface IF has a light emitting line, which has the first light emitting element LE0 and the second light emitting elements LE1-LEm, and a light detecting line, which has the first light detecting elements LD1-LDm and the second light detecting element LD0. The light emitting line and light detecting line are disposed on a integrated circuit board B in parallel each other as one package. The optical axes of the light emitting elements LE0 and LE1-LEm are aligned with the optical axes of the light detecting elements LD1-LDm and LD0.

The above optical axes of the light emitting elements and light detecting elements can be aligned with a reflector disposed opposed to the board B.

Figure 9A:
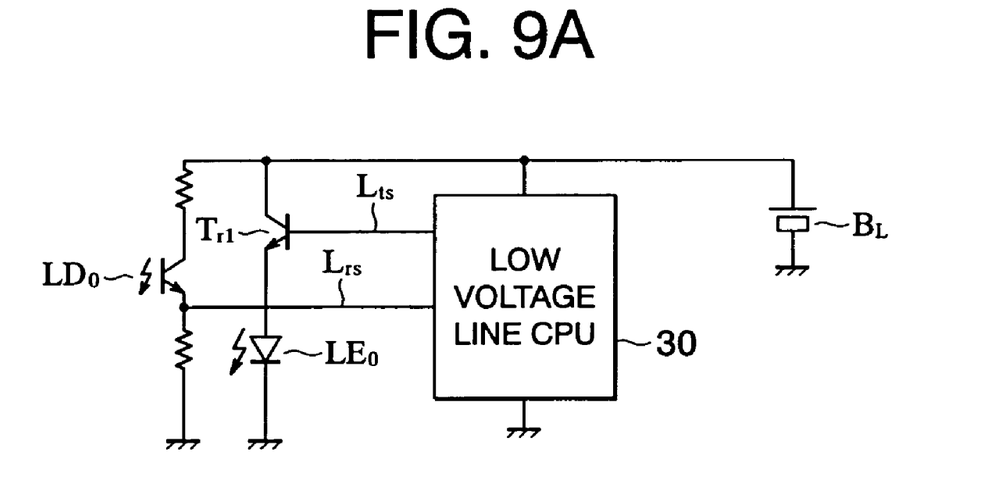
FIG. 9A is a detailed connection of the voltage detector of FIG. 7.

As shown in FIG. 9A, the first light emitting element LE0 is powered by a low voltage battery BL via a transistor Tr1. The low voltage line CPU 30 turns on and off the transistor Tr1. When the low voltage line CPU 30 turns on the transistor Tr1, the first light emitting element LE0 is powered by the low voltage battery BL and emits a light. The second light detecting element LD0 receives the light and is turned on and supply an electrical signal to the low voltage line CPU 30 via the second main line Lrs.

Figure 9B:
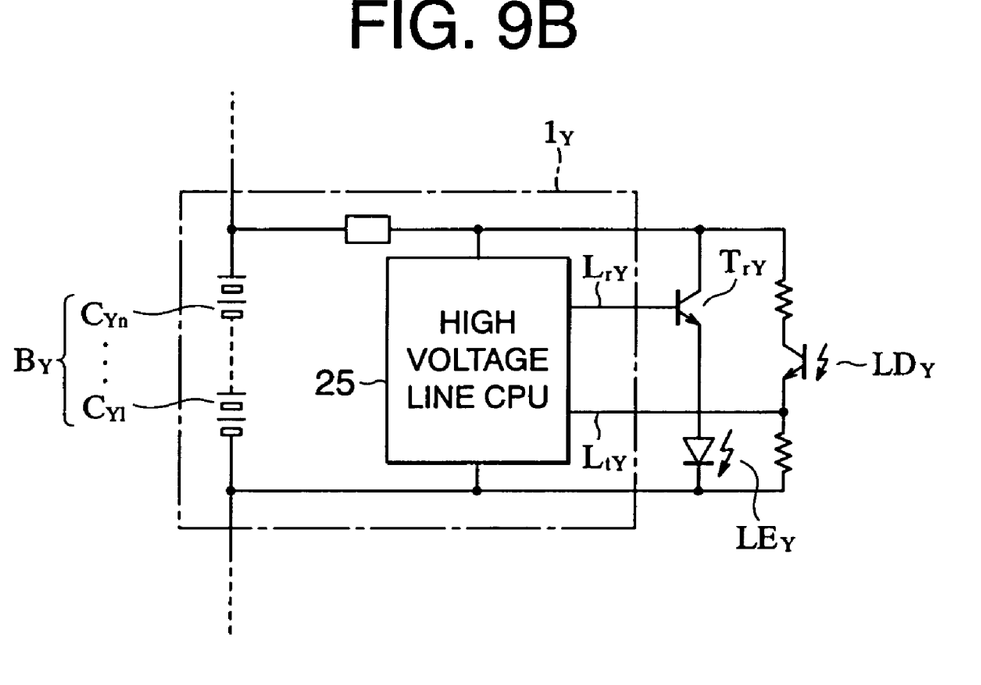
FIG. 9B is a detailed connection of the voltage detector of FIG. 7.

As shown in FIG. 9B, the second light emitting elements LE1-LEm are powered by the respective blocks B1-Bm via transistors TrY (Y is an arbitrary integral number), which are turned on and off by the respective high voltage line CPUs 25. When the high voltage line CPU 25 of the voltage detector unit 1Y turns on the transistor TrY, the second light emitting element LEY is powered by the corresponding block BY and emits a light signal. The first light detecting element LDY receives the light signal and is turned on and supplies an electrical signal to the high voltage line CPU 25 via the first branch line LtY.

The low voltage line CPU 30 controls the first light emitting element LE0 via the first main line Lts and outputs a detection instruction including an assignment of an address of the block BY. All of the first light detecting elements LD1-LDm receive and transmit the detection instructions to the voltage detector units 11-1m via the first branch lines Lt1-Ltm.

The high voltage line CPUs 25 control the second light emitting elements LE1-LEm via the second branch lines Lr1-Lrm and output the detected results assigned with self-addresses. The second light detecting element LD0 receives and transmits the detected results to the low voltage line CPU 30 via the second main line Lts.

In the first embodiment, the transmitting insulator interfaces IFt1-IFtm and the receiving insulator interfaces IFr1-IFrm are connected with the first branch lines Lt1-Ltm and the second branch lines Lr1-Lrm, respectively so that 2m light emitting elements and 2m light detecting elements are required. On the contrary, the second embodiment of the voltage detector utilizes (m+1) light emitting elements and (m+1) light detecting elements. The small number of the light emitting and detecting elements reduces the manufacturing cost.

The second embodiment has the same operation as the first embodiment but not limited thereto. In the second embodiment, the second light detecting element LD0 may receive the light signal of the first light emitting element LE0 to be judged a failure of the first light emitting element LE0 and the second light detecting element LD0 by the low voltage line CPU 30.

All of the first light and second light detecting elements LD0 and LD1-LDm can be arranged to receive all of the first and second light emitting elements LE0 and LE1-LEm but not limited thereto. All of the light detecting elements LD1-LDm receive the light signal from the first light emitting element LE0. The second light emitting elements LE1-LEm and the second light detecting element LD0 can be arranged in the second branch lines Lr1-Lrm similar to the first embodiment.

In the second embodiment, the photo-couplers are utilized for the insulator interfaces IF and the light emitting and detecting elements are utilized for transmitting elements and receiving elements, respectively but not limited thereto. A magnetic-coupler is utilized for the insulator interface IF. The transmitting elements thus transmit magnetic signals and the receiving elements receive the magnetic signals.

Third Embodiment

In the second embodiment, as shown in FIG. 8, the one package of the insulator interface IF has two terminals at the respective light emitting and detecting elements LE0, LE1-LEm, LD1-LDm, and LD0. The present invention is not limited thereto. In the third embodiment, the terminals are arranged in a manner shown in FIG. 10.

Figure 10:
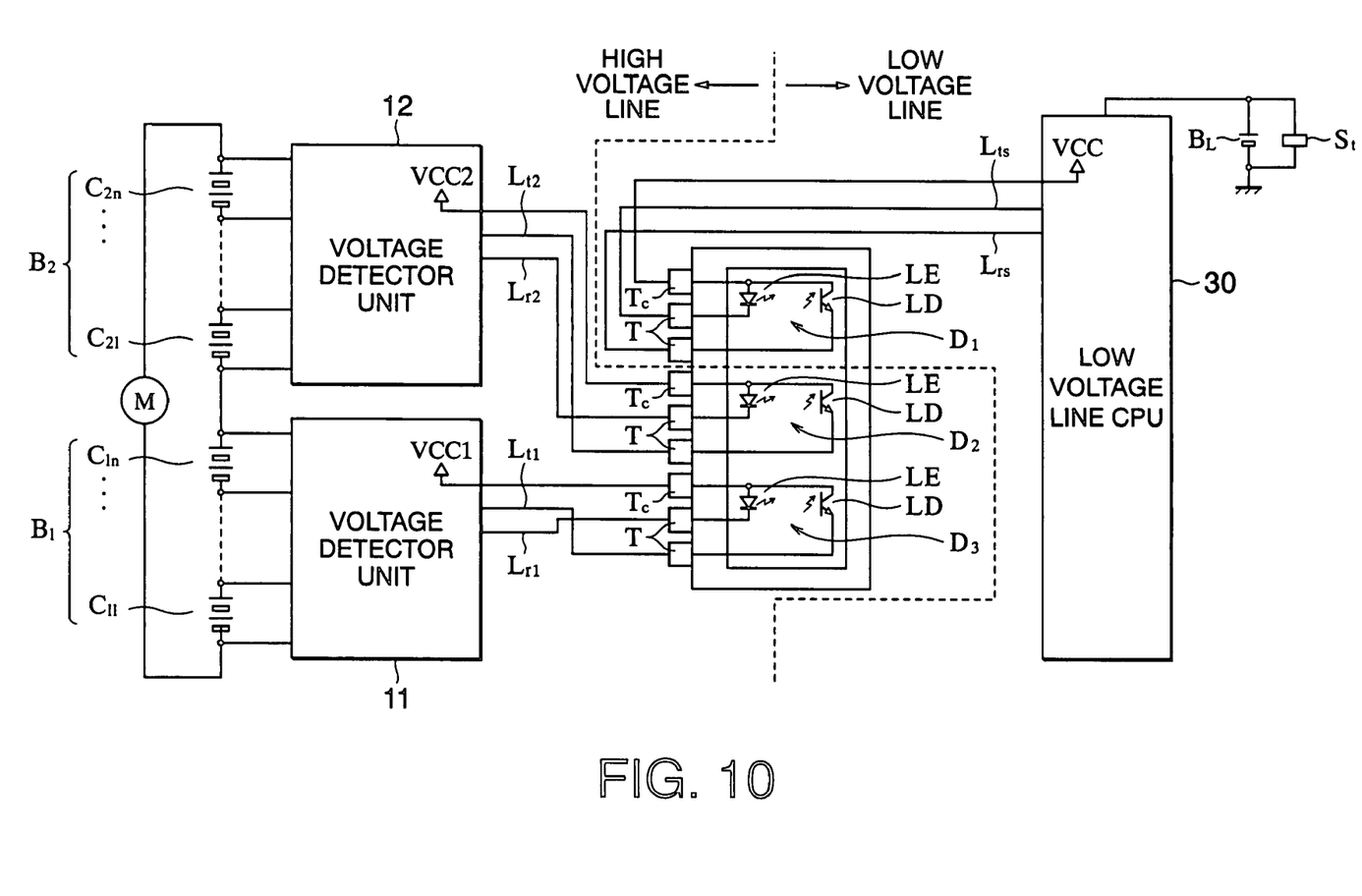
FIG. 10 is a circuitry of a third embodiment of a voltage detector of the present invention.

Reference signs of FIG. 10 have the same signs as FIG. 1 for the same parts. The detailed explanation is omitted. FIG. 10 illustrates that a voltage detector has two voltage detector units 11 and 12. The detail of the voltage detector units 11 and 12 is omitted. A transmitting bus line BLt has a first main line Lts and a plurality of first branch lines Lt1 and Lt2 similar to the first embodiment. One end of the first main line Lts is connected to a low voltage line CPU 30 and the first branch lines Lt1 and Lt2 of the first main line Lts are connected with high voltage line CPUs 25 of the voltage detector units 11 and 12.

A receiving bus line BLr has a second main line Lrs and a plurality of second branch lines Lr1 and Lr2. One end of the second main line Lrs is connected to the low voltage line CPU 30 and the branch lines Lr1 and Lr2 of the second main line Lrs are connected to the high voltage line CPUs 25 of the voltage detector units 11 and 12. In the third embodiment, an insulator interface IF has insulator devices of a number of blocks plus one, that is, three insulator devices D1-D3 in one package of the present case. The insulator devices D1-D3 each have a light emitting element LE and a light detecting element LD and are packaged into one optical device.

The insulator interface IF has common terminals Tc and terminals T. The common terminals Tc each are connected with a junction of the respective light emitting elements LE and the light detecting elements LD. The terminals T each are connected to each end of the light emitting element LE and the light detecting element LD.

The common terminal Tc of the insulator device D1 is connected with a low voltage battery BL via the low voltage line CPU 30. The terminal T connected to the light emitting element LE of the insulator device D1 is connected to the first main line Lts and the terminal T connected to the light detecting element LD thereof is connected to the second main line Lrs.

The common terminals Tc of the insulator devices D2 and D3 are connected to respective blocks B1 and B2 via the voltage detector units 11 and 12. The terminals T connected to the light emitting elements LE of the insulator devices D2 and D3 are connected to first branch lines Lr1 and Lr2, respectively. The terminals T connected to the light detecting elements LD of the insulator devices D2 and D3 are connected to second branch lines Lt1 and Lt2, respectively.

All of the light detecting elements LD can receive lights from all of the light emitting elements LE in the insulator interface IF.

The low voltage line CPU 30 controls an emission of the light emitting element LE of the insulator device D1 via the first main line Lts and outputs a detection instruction to assign an address of a block BY. All of the light detecting elements LD of the insulator devices D2 and D3 receive and transmit the detection instruction to the voltage detector units 11 and 12 via the first branch lines Lt1 and Lt2.

The high voltage line CPUs 25 control emissions of the light emitting elements LE of the insulator devices D2 and D3 via the second branch lines Lr1 and Lr2 and outputs detected results including the assigned addresses of the blocks B1 and B2. The light detecting element LD of the insulator device D1 receives and transmits the detected results to the low voltage line CPU 30 via the second main line Lrs.

In the first embodiment, the transmitting insulator interfaces IFt1-IFtm and the receiving insulator interfaces IFr1-IFrm are connected to the first branch lines Lt1-Ltm and the second branch lines Lr1-Lrm, respectively so that 2m light emitting elements and 2m light detecting elements are required. On the contrary, the third embodiment of the voltage detector utilizes (m+1) light emitting elements and (m+1) light detecting elements. The small number of the light emitting and detecting elements reduces the manufacturing cost.

The common terminals Tc are connected to the junctions of the light emitting and detecting elements LE and LD of the insulator devices D1-D3 so that the number of the terminals is decreased compared with the second embodiment of FIG. 8.

The insulator devices D1-D3 are formed in the one package of the optical device to achieve a simple configuration and low cost manufacturing.

The above described embodiments are only exemplary but not limited thereto. Any modifications and alterations thereof are within the scope of the present invention.

What is claimed is:

1. A voltage detector comprising:
a plurality of voltage detector units for detecting output voltages of cells and transmitting the detected results, the voltage detector units each being powered by an associated block of a plurality of blocks divided from a high voltage battery having a plurality of secondary unit cells connected in series each other;
a voltage detector control device powered by a low voltage battery with a voltage lower than the high voltage battery for transmitting a detection instruction to the plurality of the voltage detector units;
a communication line interconnected between the plurality of the voltage detector units and the voltage detector control device;
an insulator interface arranged on the communication line for communicating between the plurality of the voltage detector units and the voltage detector control device in an electrically insulated manner; wherein
the communication line has a first communication line for transmitting the detection instruction, the first communication line having a first main line and a plurality of first branch lines, one end of the first main line being connected to the voltage detector control device, the plurality of the first branch lines being branched from the first main line and connected to the respective voltage detector units;
the voltage detector control device transmits the detection instruction including an assignment of an address of the blocks to the plurality of the voltage detector units through the first communication line; and
the plurality of the voltage detector units each detect the output voltages of the associated block when the address of the detection instruction transmitted from the voltage detector control device through the first communication line is a self-address of the voltage detector unit.

2. The voltage detector as claimed in claim 1, wherein the communication line has a second communication line for transmitting the detected results, the second communication line having a second main line and a plurality of second branch lines, one end of the second main line being connected to the voltage detector control device, the plurality of the second branch lines being branched from the second main line and connected to the respective voltage detector units.

3. The voltage detector as claimed in claim 1, wherein
the insulator interface has a first transmitting element connected to one end of the first main line for transmitting an optical or magnetic signal, and a plurality of first receiving elements connected to ends of the first branch lines for receiving the optical and magnetic signal, and
the first transmitting element and the plurality of the first receiving elements are arranged so as that all of the first receiving elements can receive the optical or magnetic signal from the first transmitting element.

4. The voltage detector as claimed in claim 2, wherein
the insulator interface includes the first transmitting element connected to the one end of the first main line for transmitting the optical or magnetic signal, the plurality of the first receiving elements connected to the ends of the first branch lines for receiving the optical or magnetic signal, a second receiving element connected to one end of the second main line for receiving the optical or magnetic signal, and a plurality of second transmitting elements connected ends of the second branch lines for transmitting the optical or magnetic signals, and
the first transmitting element, the first receiving elements, the second transmitting elements, and the second receiving element are arranged so as that all of the first and second receiving elements can receive the optical or magnetic signals from all of the first and second transmitting elements.

5. The voltage detector as claimed in claim 1, wherein a branch point of the main line and each branch line is placed between the voltage detector control device and the insulator interface.

6. The voltage detector as claimed in claim 1, wherein the plurality of the voltage detector units have external resistors having different values of resistances to be recognized as self-addresses.

7. The voltage detector as claimed in claim 1, wherein
the plurality of the voltage detector units each have a sensor device for detecting the output voltages of the unit cells of the respective blocks and outputting the detected results, and a control device for transmitting the detected results to the voltage detector control device from the sensor device responsive to the detection instruction,
the voltage detector control device transmits a cutoff instruction through the first communication line, and
the control device cutoffs the electrical power to the sensor device when received the cutoff instruction.

8. A voltage detector comprising:
a plurality of voltage detector units for detecting output voltages of cells and transmitting the detected results, the voltage detector units each being powered by an associated block of a plurality of blocks divided from a high voltage battery having a plurality of secondary unit cells connected in series each other;
a voltage detector control device powered by a low voltage battery with a voltage lower than the high voltage battery for transmitting a detection instruction to the plurality of the voltage detector units;
a communication line interconnected between the plurality of the voltage detector units and the voltage detector control device;
an insulator interface arranged on the communication line for communicating between the plurality of the voltage detector units and the voltage detector control device in an electrically insulated manner; wherein
the insulator interface has a plurality of insulator devices formed with a pair of light emitting elements and light detecting elements operated with a same voltage supply and connected to the voltage detector control device and the respective voltage detector units,
the light emitting and detecting elements are electrically insulated and arranged so as that all of the light detecting elements can receive lights from at least the light emitting element of the insulator devices connected to the voltage detector control device,
the voltage detector control device transmits the detection instruction including an assignment of an address of one of the blocks through the light emitting element to the plurality of the voltage detector units; and
the plurality of the voltage detector units detect the output voltages of the blocks when the address of the detection instruction transmitted from the voltage detector control device through the light emitting element of the insulator device are self-addresses.

9. The insulator interface utilized in the voltage detector as claimed in claim 8, wherein the insulator interface has a plurality of the insulator devices as one package.

10. The insulator interface as claimed in claim 9, wherein the insulator devices have a plurality of common terminals connected to the respective junctions of the light emitting and detecting elements, and a plurality of terminals connected to each end of the light emitting and light detecting elements.

11. The insulator interface as claimed in claim 9, wherein the insulator devices are formed in one optical device as one package.

* * * * *